(12) United States Patent
Cheng et al.

(10) Patent No.: US 12,389,643 B2
(45) Date of Patent: *Aug. 12, 2025

(54) SEMICONDUCTOR DEVICE STRUCTURE

(71) Applicant: Taiwan Semiconductor Manufacturing Company, Ltd., Hsinchu (TW)

(72) Inventors: Jung-Chien Cheng, Tainan (TW); Kuo-Cheng Chiang, Hsinchu County (TW); Shi Ning Ju, Hsinchu (TW); Guan-Lin Chen, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,214

(22) Filed: Nov. 27, 2023

(65) Prior Publication Data

US 2024/0096942 A1 Mar. 21, 2024

Related U.S. Application Data

(60) Continuation of application No. 17/871,697, filed on Jul. 22, 2022, now Pat. No. 11,855,138, which is a
(Continued)

(51) Int. Cl.
*H01L 29/00* (2006.01)
*H01L 27/082* (2006.01)
(Continued)

(52) U.S. Cl.
CPC ......... *H10D 62/115* (2025.01); *H10D 30/024* (2025.01); *H10D 30/6211* (2025.01);
(Continued)

(58) Field of Classification Search
CPC ......... H01L 29/0649; H01L 21/823431; H01L 29/66795; H01L 29/7851; H01L 2029/7858
(Continued)

(56) References Cited

U.S. PATENT DOCUMENTS 7,573,108 B2   8/2009   Juengling
9,818,872 B2   11/2017  Ching
(Continued)

FOREIGN PATENT DOCUMENTS

KR   20060110702 A   10/2006
KR   20200035896 A   4/2020
(Continued)

OTHER PUBLICATIONS

Weckx, P. [et al]: Novel forksheet device architecture as ultimate logic scaling device towards 2nm. In: IEDM 2019, Feb. 13, 2020, S. 36.5.1-4.—ISSN 978-1-7281-4032-2/19. IEEE Xplore. DOI: 10.1109/IEDM19573.2019.8993635.
(Continued)

*Primary Examiner* — Theresa T Doan
(74) *Attorney, Agent, or Firm* — HAYNES AND BOONE, LLP

(57) ABSTRACT

Semiconductor structures and the manufacturing method thereof are disclosed. An exemplary semiconductor structure according to the present disclosure includes a substrate having a p-type well or an n-type well, a first base portion over the p-type well, a second base portion over the n-type well, a first plurality of channel members over the first base portion, a second plurality of channel members over the second base portion, an isolation feature disposed between the first base portion and the second base portion, and a deep isolation structure in the substrate disposed below the isolation feature.

20 Claims, 23 Drawing Sheets

Related U.S. Application Data division of application No. 17/142,970, filed on Jan. 6, 2021, now Pat. No. 11,462,612.

(60) Provisional application No. 63/106,724, filed on Oct. 28, 2020.

(51) Int. Cl.
*H01L 27/102* (2023.01)
*H10D 30/01* (2025.01)
*H10D 30/62* (2025.01)
*H10D 30/67* (2025.01)
*H10D 62/10* (2025.01)
*H10D 84/01* (2025.01)
*H10D 84/03* (2025.01)

(52) U.S. Cl.
CPC ....... *H10D 30/6735* (2025.01); *H10D 62/121* (2025.01); *H10D 84/0158* (2025.01); *H10D 84/038* (2025.01); *H10D 30/6219* (2025.01)

(58) Field of Classification Search
USPC ........................................ 257/506
See application file for complete search history.

(56) References Cited

U.S. PATENT DOCUMENTS

| | | |
|---|---|---|
| 9,887,269 B2 | 2/2018 | Ching |
| 9,899,398 B1 | 2/2018 | Colinge |
| 10,032,627 B2 | 7/2018 | Lee |
| 10,109,721 B2 | 10/2018 | Lin |
| 10,157,799 B2 | 12/2018 | Ching |
| 10,199,502 B2 | 2/2019 | Huang |
| 10,290,546 B2 | 5/2019 | Chiang |
| 10,475,902 B2 | 11/2019 | Lee |
| 11,462,612 B2 * | 10/2022 | Cheng ................ H01L 29/0673 |
| 2006/0240622 A1 | 10/2006 | Lee |
| 2012/0261792 A1 | 10/2012 | Cheng |
| 2014/0315371 A1 | 10/2014 | Cai |
| 2018/0158912 A1 | 6/2018 | Han |
| 2018/0175036 A1 | 6/2018 | Ching |
| 2019/0393040 A1 | 12/2019 | Chen |
| 2020/0058564 A1 | 2/2020 | Hsu |
| 2020/0105612 A1 | 4/2020 | Lin |
| 2020/0105889 A1 | 4/2020 | Liaw |

FOREIGN PATENT DOCUMENTS

| | | |
|---|---|---|
| TW | 201926552 A | 7/2019 |
| TW | 1688991 B | 3/2020 |
| TW | 202038331 A | 10/2020 |

OTHER PUBLICATIONS

Ritzenthaler, R. [et al]: Isolation of nanowires made on bulk wafers by ground plane doping. In: ESSDERC 2017, 2017, S. 300-303.— ISSN 2378-6558 IEEE Xplore. DOI: 10.1109/ESSDERC.2017.8066651.

* cited by examiner

SEMICONDUCTOR DEVICE STRUCTURE

PRIORITY DATA

This application is a continuation application of U.S. patent application Ser. No. 17/871,697, filed Jul. 22, 2022, which is a divisional application of U.S. patent application Ser. No. 17/142,970, filed Jan. 6, 2021, which claims priority to U.S. Provisional Patent Application No. 63/106,724, filed on Oct. 28, 2020, entitled "Semiconductor Device Structure", each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

While MBC transistors with sheet-like channel members generally provide superior gate control and drive current, their wider sheet-like channel members may increase device widths. Such increased device widths may make them less attractive in high packing density applications, such as memory applications. Measures to improve packing density of MBC transistors may face challenges in forming isolation structures to isolate different device regions. While existing semiconductor devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
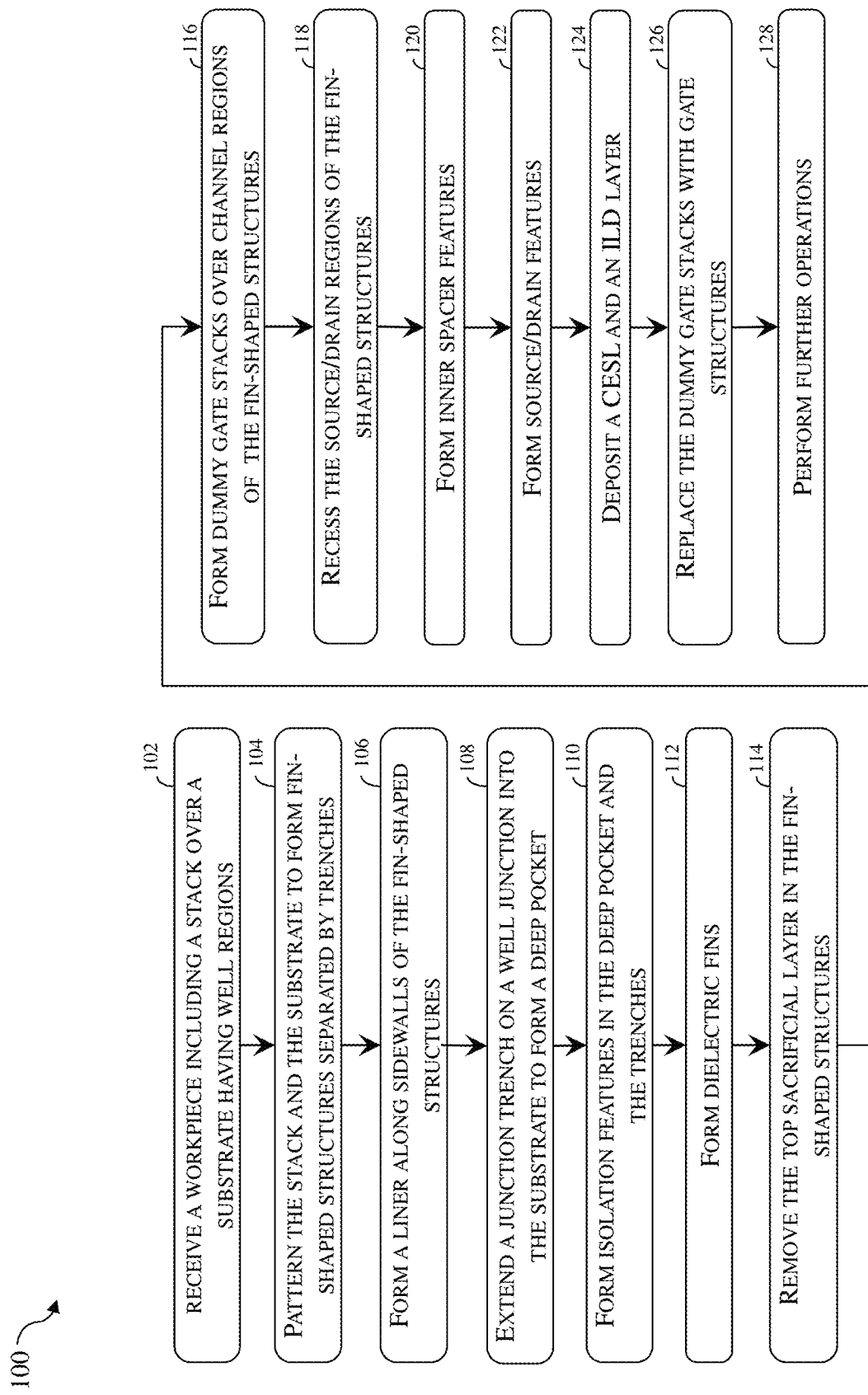
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to isolation structures to reduce bulk leakage, and more particularly to deep isolation structures disposed on well junctions.

To improve drive current to meet design needs, MBC transistors may include nanoscale channel members that are thin and wide. Such MBC transistors may also be referred to as nanosheet transistors. While nanosheet transistors are able to provide satisfactory drive current and channel control, their wider nanosheet channel members may make it challenging to further reduce cell size. In some example structures, fish-bone structures or fork-sheet structures may be implemented to reduce cell dimensions. In a fish-bone structure or a fork-sheet structure, adjacent stacks of channel members may be divided by dielectric fins (or hybrid fins). As one end of the stacks of channel members are in contact with the dielectric fins, a gate structure that wraps around the stacks of channel members does not extend between the channel members and the dielectric fin. Each of the dielectric fins is disposed on an isolation feature, such as a shallow trench isolation (STI) feature. An STI feature may also be disposed on a junction between an n-type well and a p-type well to reduce bulk leakage.

The present disclosure provides a deep isolation structure that is disposed at a well junction between a p-type well under an n-type device and an n-type well under a p-type device. In some embodiments, the formation of the deep isolation structure includes formation of a notch along the well junction. The notch may undercut active regions of the n-type device and the p-type device. In at least some embodiments, the n-type device and p-type device may be fish-bone or fork-sheet transistors. The deep isolation structure may better block the bulk leakage path between the n-type well and the p-type well.

The various aspects of the present disclosure will now be described in more detail with reference to the figures. FIG. 1 illustrates a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-23, which illustrate fragmentary cross-sectional views of a workpiece 200 at different stages of fabrication according to embodiments of method 100. Because a semiconductor device will be formed from the workpiece 200, the workpiece 200 may be referred to as a semiconductor device 200 as the context requires. Although embodiments that include fish-bone or fork-sheet transistors are illustrated in the figures, the present disclosure is not so limited and may be applicable to other multi-gate devices, such as MBC transistors or FinFETs. Throughout FIGS. 2-23, the X direction, the Y direction, and the Z direction are perpendicular to one another and are used consistently. Additionally, throughout the present disclosure, like reference numerals are used to denote like features.

Figure 2:
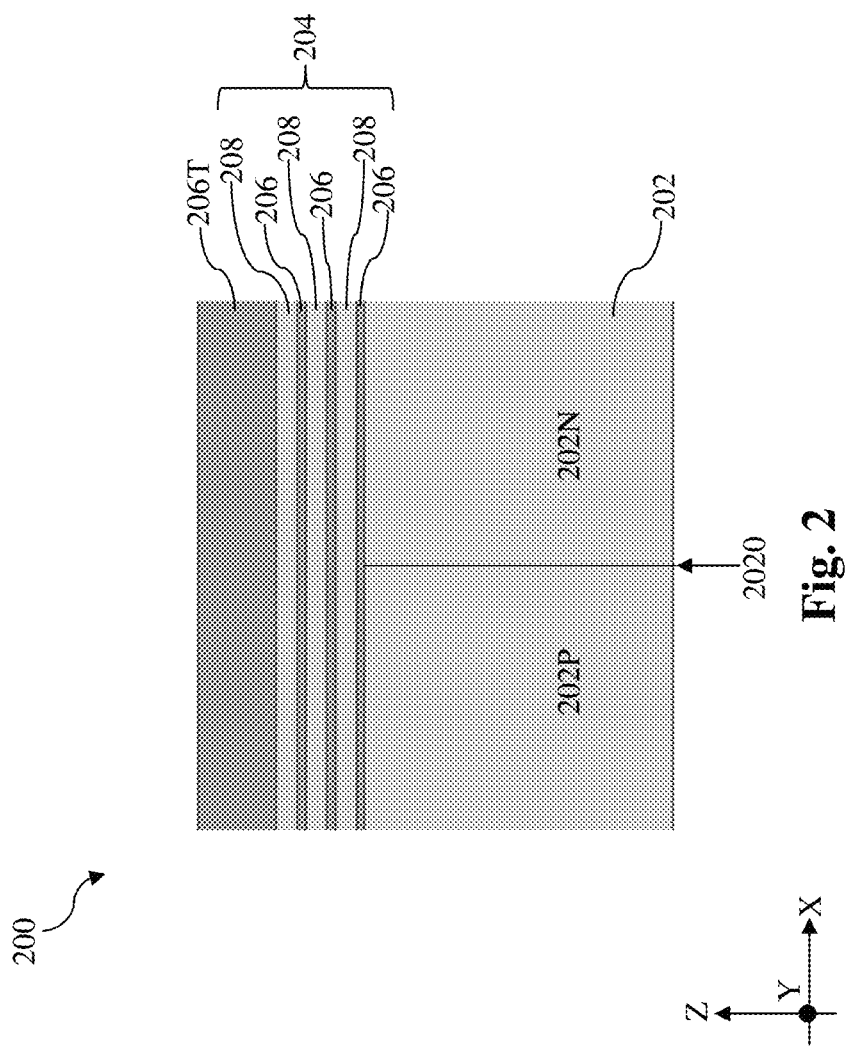
FIGS. 2-23 illustrate fragmentary perspective views or cross-sectional views of a workpiece during various fabrication stages in the method of FIG. 1, according to one or more aspects of the present disclosure.

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. In the depicted embodiment, the substrate 202 includes a p-type well region 202P (or p-well 202P) and an n-type well region 202N (or n-well 202N). As shown in FIG. 2, the p-well 202P and the n-well 202N interface one another along a well junction 202O. The p-well 202P may be doped with a p-type dopant (i.e., boron (B) and the n-well 202N may be doped with an n-type dopant (i.e., phosphorus (P) or arsenic (As)). The p-well 202P and n-well 202N may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments represented in FIG. 2, the workpiece 200 also includes a top sacrificial layer 206T disposed on the stack 204. The top sacrificial layer 206T is thicker than the other sacrificial layers 206 and functions to protect the stack 204 from damages during fabrication processes. The top sacrificial layer 206T, the sacrificial layers 206 and the channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. FIG. 2 illustrates that three (3) layers of the sacrificial layers 206 and three (3) layers of the channel layers 208 are alternately and vertically arranged, which is for illustrative purposes only and not intended to be limiting beyond what is specifically recited in the claims. The number of layers depends on the desired number of channels members for the semiconductor device 200. In some embodiments, the number of the channel layers 208 is between 1 and 6.

Figure 3:
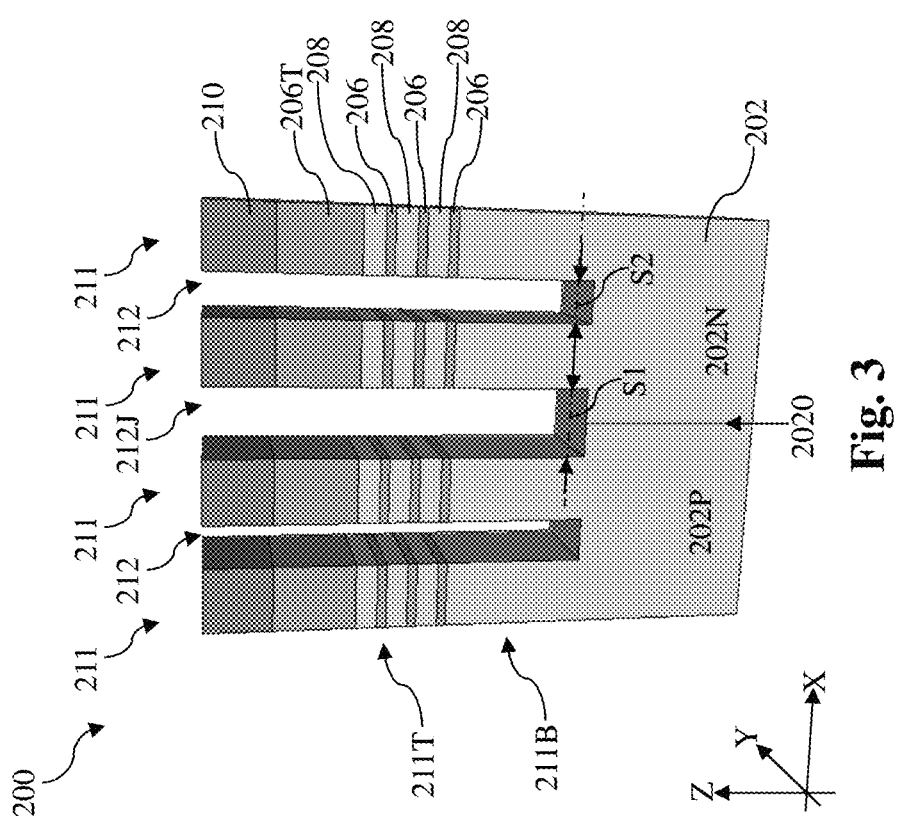

Referring to FIGS. 1 and 3, method 100 includes a block 104 where the stack 204 and the substrate 202 are patterned to form fin-shaped structures 211 separated by trenches 212 or a junction trench 212J. To pattern the stack 204 and the substrate 202, a first hard mask layer 210 is deposited over the top sacrificial layer 206T. The first hard mask layer 210 is then patterned to serve as an etch mask to pattern the top sacrificial layer 206, the stack 204 and a portion of the substrate 202. In some embodiments, the first hard mask layer 210 may be deposited using CVD, plasma-enhanced CVD (PECVD, atomic layer deposition (ALD), plasma-enhanced ALD (PEALD), or a suitable deposition method. The first hard mask layer 210 may be a single layer or a multilayer. When the first hard mask layer 210 is a multilayer, the first hard mask layer 210 may include a pad oxide and a pad nitride layer. In an alternative embodiment, the first hard mask layer 210 may include silicon (Si). The fin-shaped structures 211 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process.

Spacers are formed alongside the patterned material layer using a self-aligned process. The material layer is then removed, and the remaining spacers, or mandrels, may then be used to pattern the first hard mask layer 210 and then the patterned first hard mask layer 210 may be used as an etch mask to etch the stack 204 and the substrate 202 to form fin-shaped structures 211. The etching process can include dry etching, wet etching, reactive ion etching (RIE), and/or other suitable processes.

As shown in FIG. 3, each of the fin-shaped structures 211 includes a base portion 211B formed from a portion of the substrate 202 and a top portion 211T formed from the stack 204. The top portion 211T is disposed over the base portion 211B. The fin-shaped structures 211 extend lengthwise along the Y direction and extend vertically along the Z direction from the substrate 202. Along the X direction, the fin-shaped structures 211 are separated by trenches 212 and junction trenches 212J. Compared to the trenches 212, the junction trench 212J is disposed on and along the well junction 2020. In some embodiments represented in the FIG. 3, the junction trench 212J is wider than a trench 212 along the X direction to provide greater spacing. As shown in FIG. 3, the junction trench 212J defines a first spacing S1 and the trench 212 defines a second spacing S2. The first spacing S1 is greater than the second spacing S2. In some instances, the first spacing S1 is between about 20 nm and about 30 nm and the second spacing S2 is between about 10 nm and about 20 nm. The wider junction trench 212J allows active regions, such as the fin-shaped structures 211, on either side of the well junction 2020 to be spaced further apart to reduce bulk leakage.

Figure 4:
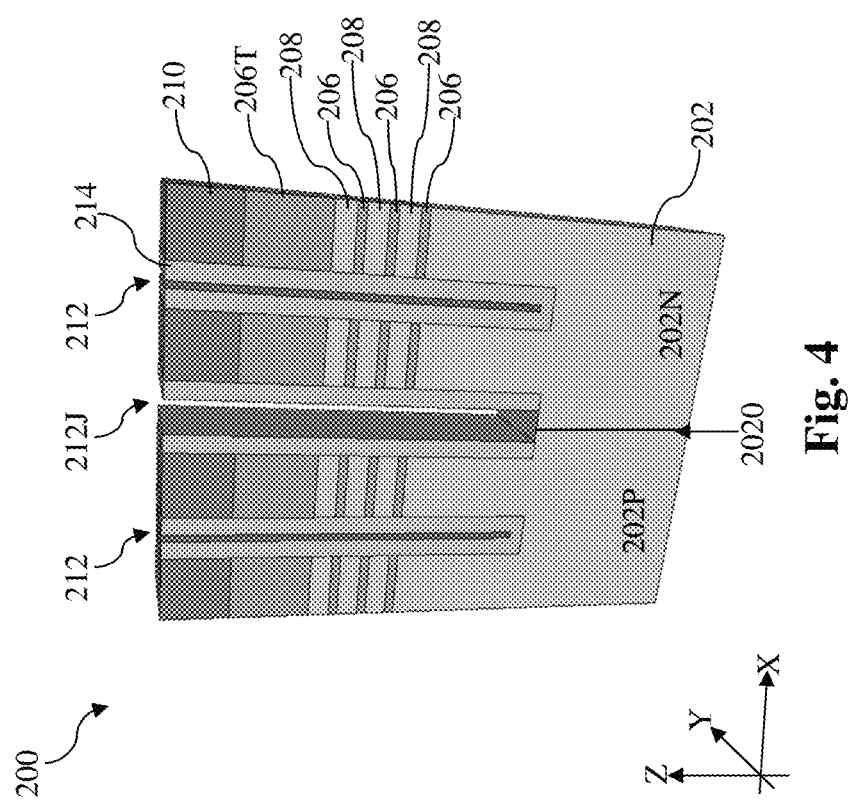

Referring to FIGS. 1 and 4, method 100 includes a block 106 where a liner 214 is formed along sidewalls of the fin-shaped structure 211. The liner 214 functions to protect sidewalls of the fin-shape structures 211 from being damaged during block 108 (to be described below). In an example process to form the liner 214, a dielectric material is conformally deposited over the workpiece 200, including over the trenches 212 and the junction trench 212J, by atomic layer deposition (ALD), chemical vapor deposition (CVD), or low-pressure CVD (LPCVD). The dielectric material for the liner 214 may include silicon oxide, silicon nitride, silicon oxynitride, silicon oxycarbide, silicon carbonitride, silicon oxycarbonitride, or a combination thereof. The deposited dielectric material is then anisotropically etched back to form the liner 214. In some embodiments, the etch back may include a dry etch process that uses one or more fluorine-containing gas, such as carbon tetrafluoride ($CF_4$), sulfur hexafluoride ($SF_6$), or nitrogen trifluoride ($NF_3$). As illustrated in FIG. 4, because first spacing S1 in the junction trench 212J is greater, the dielectric material on the bottom surface of the junction trench 212J is removed to expose the substrate 202. That is, the liner 214 only lines sidewalls of the junction trench 212J. The smaller second spacing S2 of the trench 212 prevents removal of the dielectric material from the its bottom surfaces.

Figure 5:
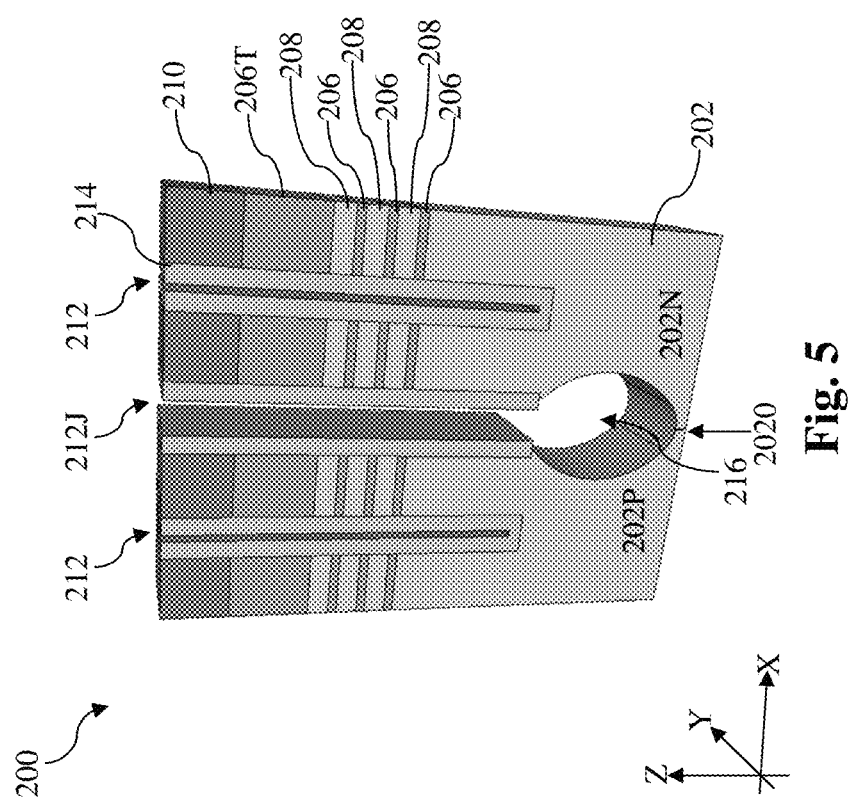

Referring to FIGS. 1 and 5, method 100 includes a block 108 where the junction trench 212J is extended into the substrate 202 to form a deep pocket 216. With the trenches 212 protected by the liner 214 and the substrate 202 exposed from the bottom surface of the junction trench 212J, operations at block 108 etches the exposed substrate 202 down the junction trench 212J. The etching of the exposed substrate 202 extends the junction trench 212J downward into the substrate 202 to form the deep pocket 216. The deep pocket 216 may also be referred to as a notch. The etch at block 108 may be performed using a dry etch process, which tends to be anisotropic, or a wet etch process, which tends to be isotropic. An example selective wet etch process may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example selective dry etch process may include use of sulfur hexafluoride ($SF_6$), hydrogen ($H_2$), ammonia ($NH_3$), hydrogen fluoride (HF), carbon tetrafluoride ($CF_4$), argon (Ar), or a mixture thereof. In some embodiments represented in FIG. 5, the etch process at block 108 is not perfectly anisotropic and the deep pocket 216 undercuts the liner 214. As a result, a shape of the deep pocket 216 is different from a shape of the junction trench 212J. In some instances, a width of the widest portion of the deep pocket 216 is greater than a width of the junction trench 212J (the liner 214 included). The deep pocket 216 is disposed in a level below the bottom surfaces of the trenches 212 or the junction trench 212J before the formation of the deep pocket 216. Accordingly, the deep pocket 216 is disposed deeper in the substrate 202.

Figure 6:
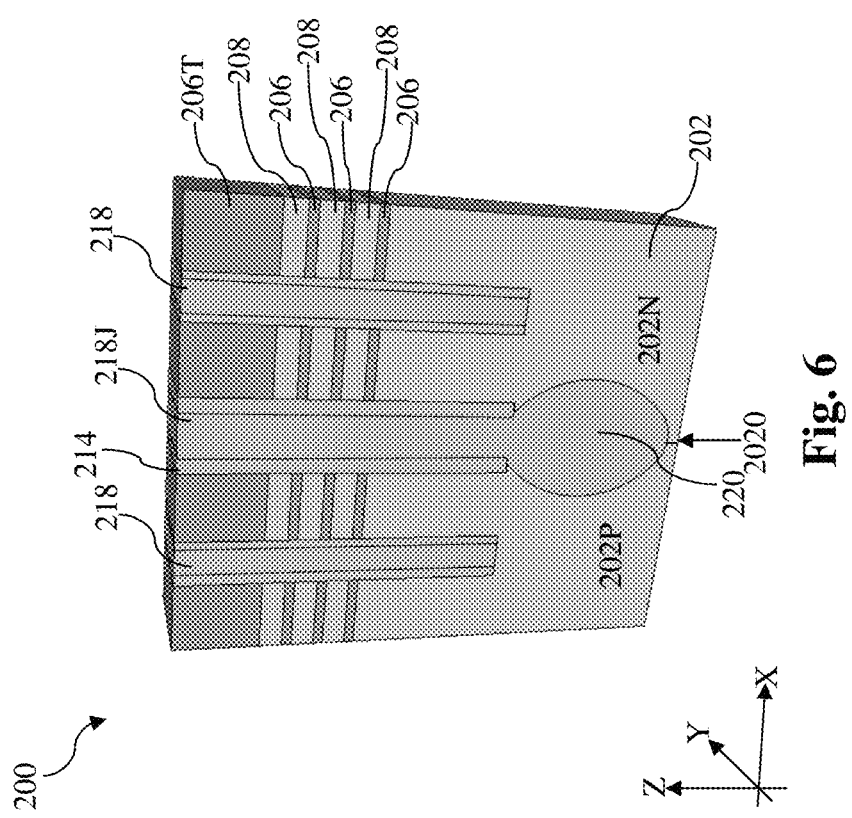
Figure 7:
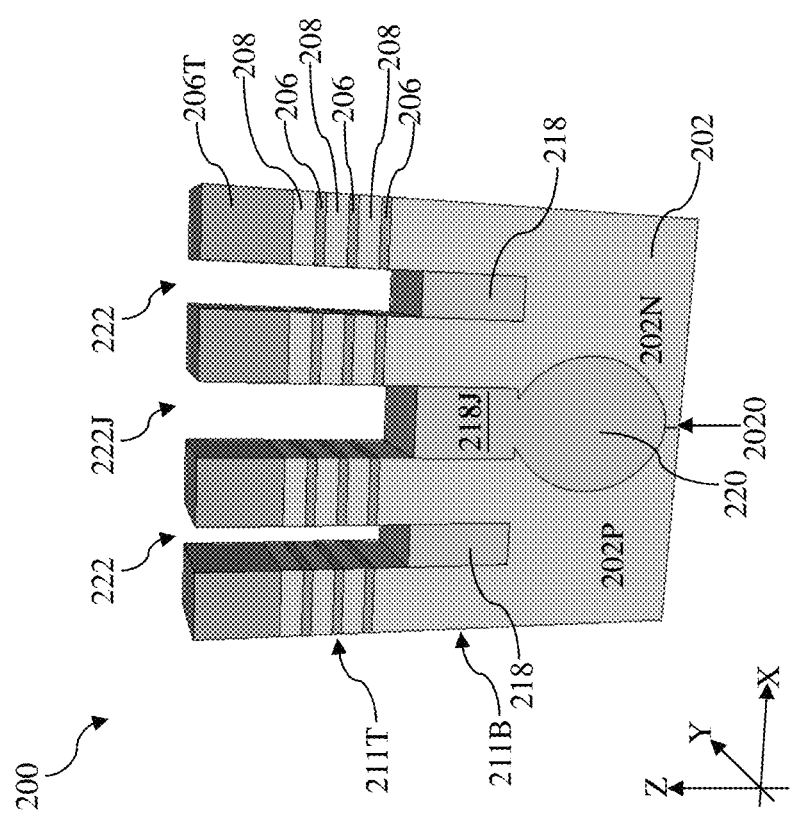

Referring to FIGS. 1, 6 and 7, method 100 includes a block 110 where isolation features are formed into the deep pocket 216 and trenches 212. Isolation features formed at block 110 may include isolation features 218 in trenches 212, and junction isolation features 218J in the junction trench 212J, and a deep isolation feature 220 in the deep pocket 216. The isolation features 218 and the junction isolation feature 218J may be collectively referred to as a shallow trench isolation (STI) feature. In an example process to form these isolation features, a dielectric material is deposited over the workpiece 200, filling the trenches 212, the deep pocket 216, and the junction trenches 212J with the dielectric material. In some embodiments, the dielectric material may include silicon oxide, silicon nitride, silicon oxynitride, silicon oxycarbide, silicon carbonitride, silicon oxycarbonitride, or a combination thereof. In various examples, at block 110, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until the top sacrificial layer 206T is exposed, as shown in FIG. 6. In some embodiments, compositions of the liner 214 and the dielectric material for the isolation features may be similar and their boundaries are marked by dotted lines. For ease of illustration, the boundaries between the liner 214 and the isolation features may be omitted in subsequent figures. Referring to FIG. 7, the planarized dielectric material and the liner 214 is further recessed by a dry etching process, a wet etching process, and/or a combination thereof to form the final structures of the isolation features 218, the junction isolation features 218J, and the deep isolation feature 220. As shown in FIG. 7, the top portions 211T of the fin-shaped structures 211 rise above the isolation features 218 or the junction isolation feature 218J while the base portions 211B, or a substantial portion thereof, is surrounded by the isolation features 218 or the junction isolation feature 218J. As shown in FIG. 7, the deep isolation feature 220 is disposed below the level of the base portions 211B and may undercut base portions 211B adjacent the well junction 2020. That is, a portion of the deep isolation feature may extend under the adjacent base portions 211B. After the formation of the isolation features 218 and the junction isolation feature 218J, the top portions 211T are separated by dielectric fin trenches 222 and a junction dielectric fin trench 222J. The junction dielectric fin trench 222J is disposed directly over the well junction 2020.

Figure 8:
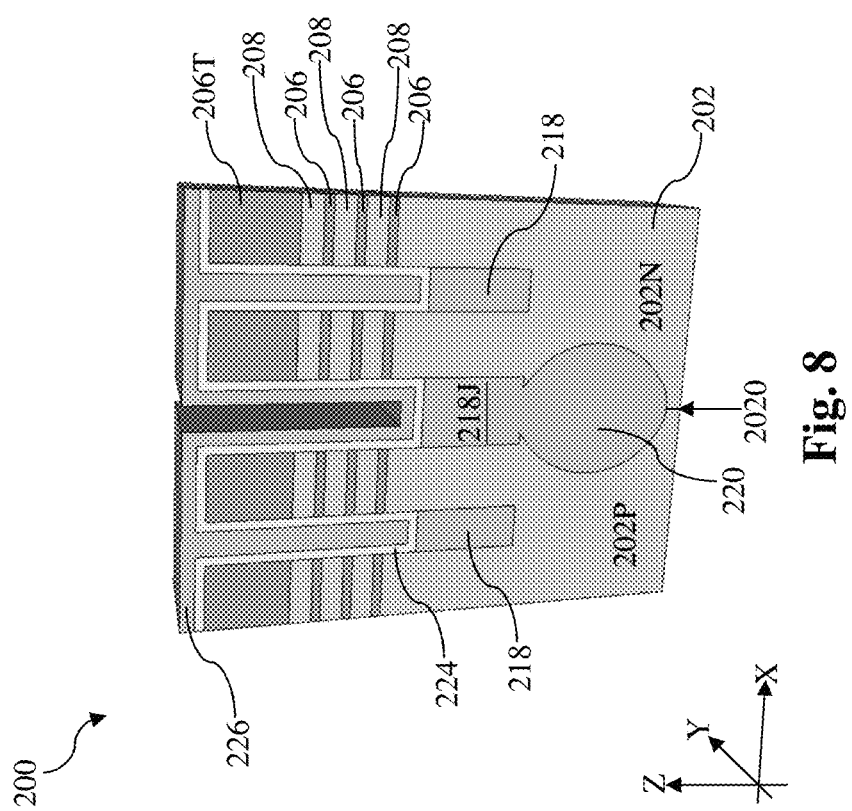

Referring to FIGS. 1, 8, 9, 10, and 11, method 100 includes a block 112 where the dielectric fins are formed. In the embodiment depicted in FIG. 11, at block 112, dielectric fins 230 are formed in the dielectric fin trenches 222 and a junction dielectric fin 230J is formed in the junction dielectric fin trench 222J. An example process to form the dielectric fins are illustrated in FIGS. 8, 9, 10, and 11. Referring to FIG. 8, a first layer 224 and a second layer 226 are conformally deposited over the workpiece 200, including in the dielectric fin trenches 222 and the junction dielectric fin trench 222J. The first layer 224 may be conformally deposited using CVD, ALD, or a suitable method. The first layer 224 lines the sidewalls and the bottom surfaces of the dielectric fin trenches 222 and the junction dielectric fin trench 222J. The second layer 226 is then conformally deposited over the first layer 224 using CVD, high density plasma CVD (HDPCVD), and/or other suitable process. In some instances, a dielectric constant of the second layer 226 is smaller than that of the first layer 224. The first layer 224 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first layer 224 includes silicon carbonitride. The second layer 226 may include silicon oxide, silicon carbide, silicon oxynitride, silicon oxycarbonitride, or a suitable dielectric material. In one embodiment, the second layer 226 includes silicon oxide. In some embodiments represented in FIG. 8, due to width differences, the second layer 226 completely fills the dielectric fin trenches 222 but does not completely fill the junction dielectric fin trench 222J.

Figure 9:
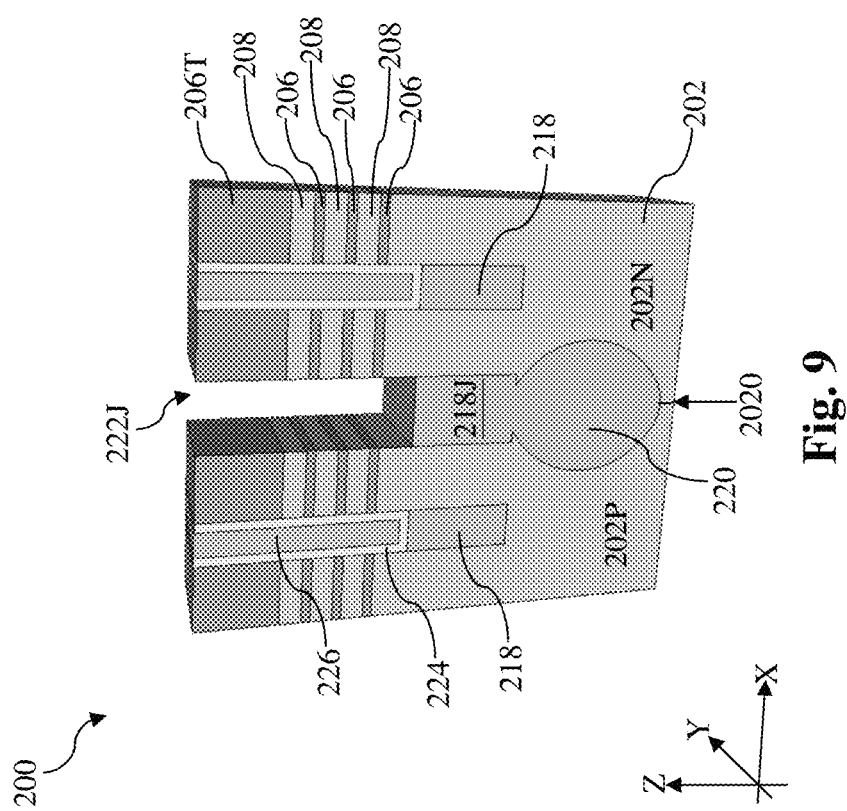

Referring to FIG. 9, the conformally deposited first layer 224 and second layer 226 are etched back to expose the top sacrificial layer 206T and remove the first layer 224 and the second layer 226 in the junction dielectric fin trench 222J. In some embodiments, the first layer 224 and the second layer 226 may be etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second layer 226 and a second stage that is directed toward the first layer 224. As shown in FIG. 9, upon conclusion of the etch back, the junction isolation feature 218J is exposed in the junction dielectric fin trench 222J.

Figure 10:
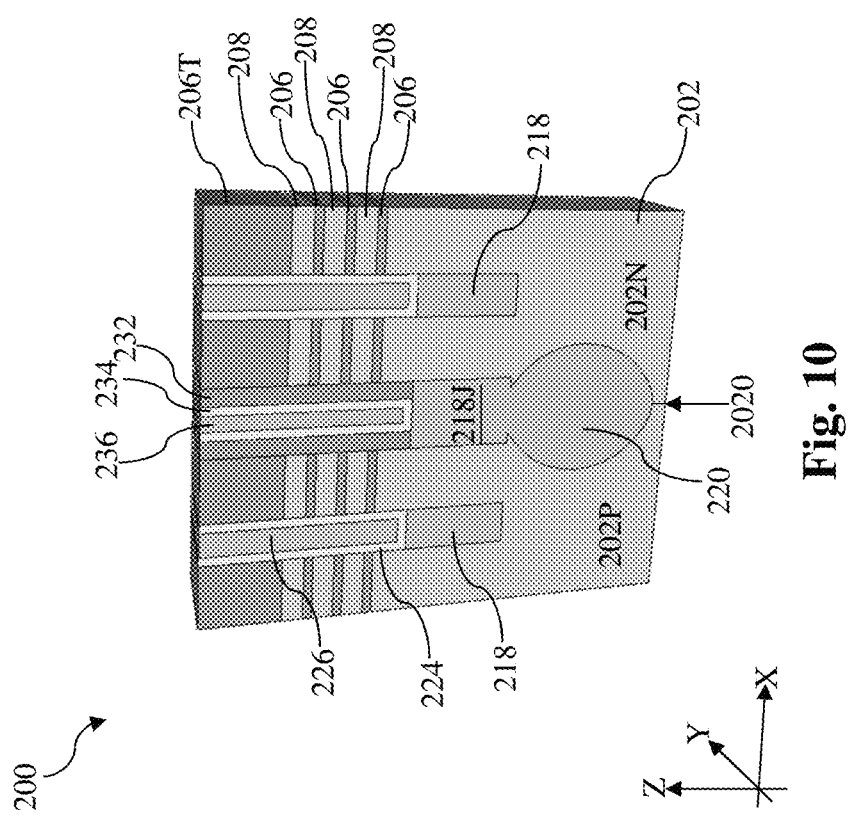

Referring now to FIG. 10, with the junction dielectric fin trench 222J exposed, a cladding layer 232 is deposited over the workpiece 200, including over the sidewalls of the junction dielectric fin trench 222J. In some embodiments, the cladding layer 232 may have a composition similar to that of the sacrificial layers 206 or the top sacrificial layer 206T. In one example, the cladding layer 232 may be formed of silicon germanium (SiGe). Their common composition allows selective and simultaneous removal of the sacrificial layers 206 and the cladding layer 232 in a subsequent process. In some embodiments, the cladding layer 232 may be conformally and epitaxially grown using vapor phase epitaxy (VPE) or molecular beam epitaxy (MBE). As shown in FIG. 10, the cladding layer 232 is selectively disposed on exposed sidewall surfaces in the junction dielectric fin trench 222J. Depending on the extent of the selective growth of the cladding layer 232, an etch back process may be performed to expose the junction isolation feature 218J. Still referring to FIG. 10, a third layer 234 and a fourth layer 236 are conformally deposited into the junction dielectric fin trench 222J. The composition and the formation of the third layer 234 may be similar to those of the first layer 224. The fourth layer 236 may include silicon oxide or a silicon oxide containing dielectric material. In some embodiments, the fourth layer 236 may be deposited using CVD, HDPCVD, or flowable CVD (FCVD). In one embodiment, the fourth layer 236 may be deposited using FCVD. After the deposition of the third layer 234 and the fourth layer 236, the workpiece 200 is planarized using a chemical mechanical polishing (CMP) process to expose the top sacrificial layer 206T.

Figure 11:
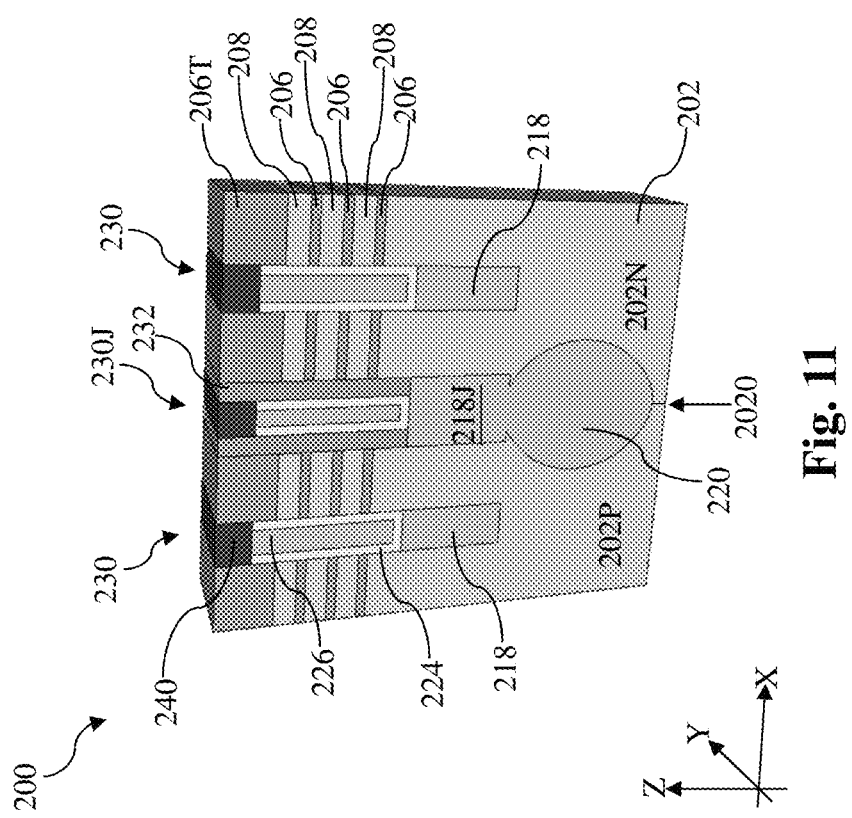

Reference is made to FIG. 11. After the planarization, the first layer 224, the second layer 226, the third layer 234, and the fourth layer 236 are selectively etched back to form recesses and a helmet layer 240 is deposited in such recesses. In some embodiments, the selective etch back may be performed using a dry etch process that may include oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The helmet layer 240 may include silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the helmet layer 240 may be deposited using CVD, HDPCVD, or a suitable deposition technique. After the deposition of the helmet layer 240, the workpiece 200 is planarized using a CMP process to remove excess helmet layer 240 on the cladding layer 232 and the top sacrificial layer 206T. At this juncture, the dielectric fins 230 and the junction dielectric fin 230J are substantially formed. Each of the dielectric fins 230 includes the first layer 224, the second layer 226 over the first layer 224, and the helmet layer 240 over the first layer 224 and the second layer 226. The junction dielectric fin 230J includes the third layer 234, the fourth layer 236, and the helmet layer 240 over the third layer 234 and the fourth layer 236. Each of the dielectric fins 230 is disposed directly over an isolation feature 218. The junction dielectric fin 230J is disposed directly over the junction isolation feature 218J, which is disposed on the deep isolation feature 220, which is disposed over the well junction 2020.

Figure 12:
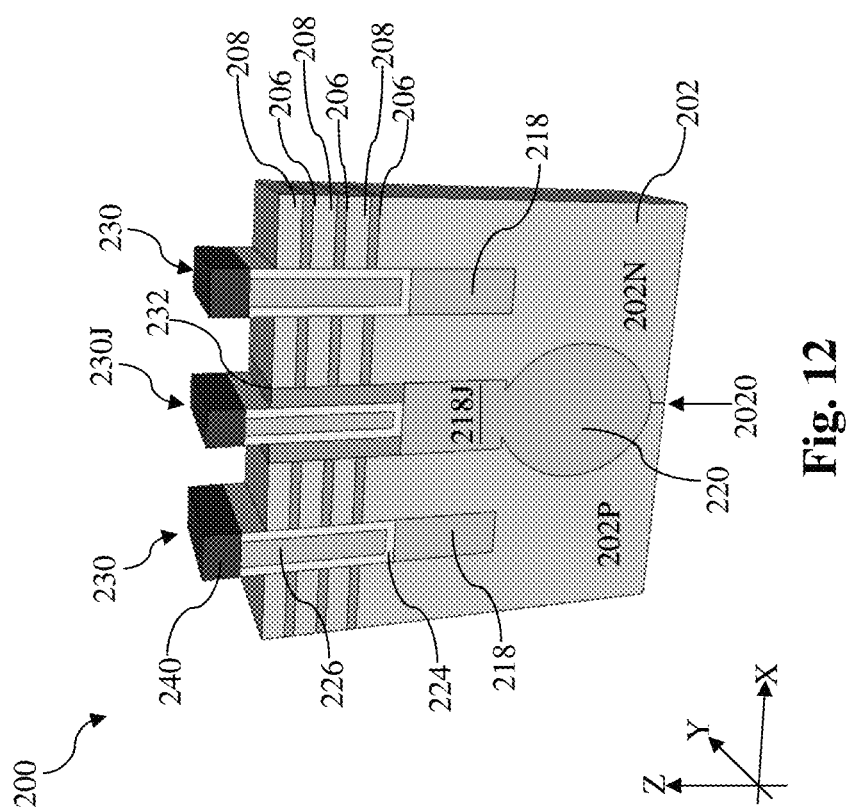

Referring to FIGS. 1 and 12, method 100 includes a block 114 where the top sacrificial layer 206T in the fin-shaped structures 211 are removed. At block 114, the workpiece 200 is etched to selectively remove a portion of the cladding layer 232 and the top sacrificial layer 206T to expose the topmost channel layer 208, without substantially damaging the helmet layer 240 of the dielectric fins 230 and the junction dielectric fin 230J. Because the top sacrificial layer 206T and the cladding layer 232 are formed of silicon germanium (SiGe), the etch process at block 114 may be selective to silicon germanium (SiGe). In some instances, the cladding layer 232 and the top sacrificial layer 206T may be etched using a selective wet etch process that includes ammonium hydroxide ($NH_4OH$), hydrogen fluoride (HF), hydrogen peroxide ($H_2O_2$), or a combination thereof. As shown in FIG. 12, after the removal of the top sacrificial layer 206T and the etching of the cladding layer 232, the dielectric fins 230 and the junction dielectric fin 230J rises above the topmost channel layer 208.

Figure 13:
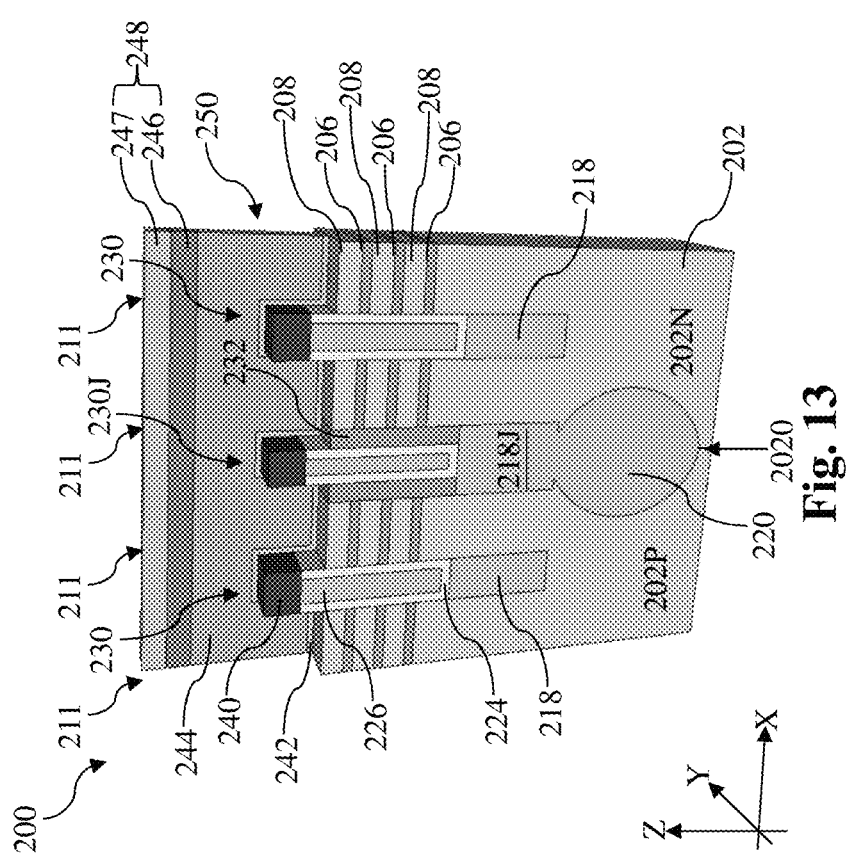
Figure 14:
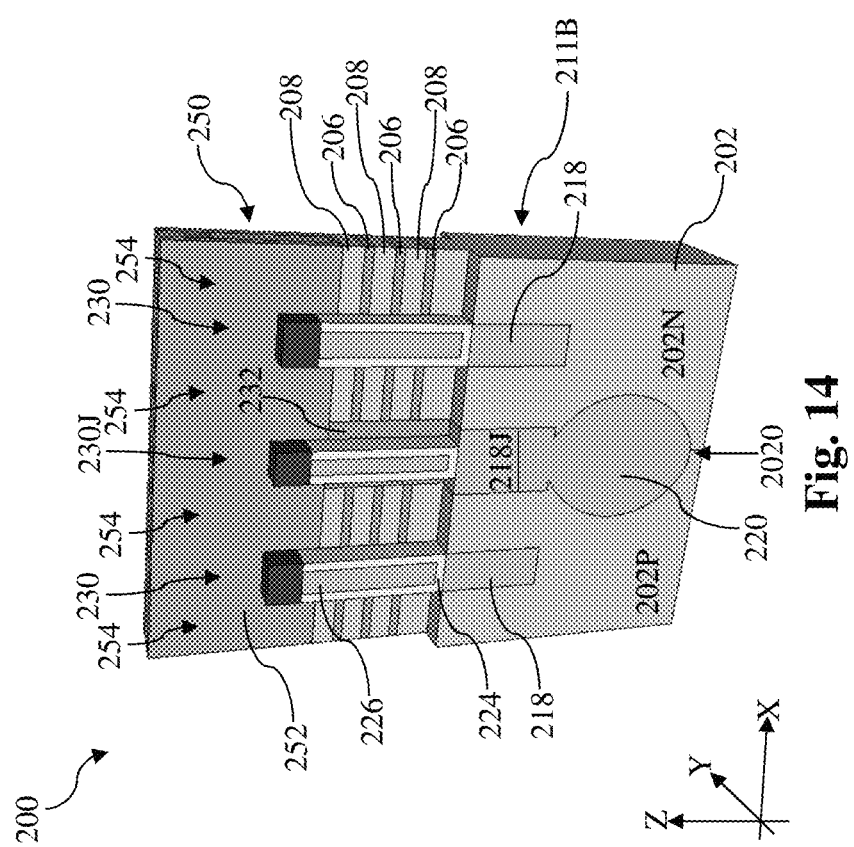

Referring to FIGS. 1, 13 and 14, method 100 includes a block 116 where a dummy gate stack 250 is formed over the channel regions of the fin-shaped structures 211. In some embodiments, a gate replacement process (or gate-last process) is adopted where the dummy gate stack 250 serves as a placeholder for a functional gate structure. Other processes and configuration are possible. As shown in FIG. 13, the dummy gate stack 250 includes a dummy dielectric layer 242, a dummy electrode 244 disposed over the dummy dielectric layer 242. For patterning purposes, a gate top hard mask 248 is deposited over the dummy gate stack 250. The gate top hard mask 248 may be multi-layer and include a silicon nitride mask layer 246 and a silicon oxide mask layer 247 over the silicon nitride mask layer 246. The regions of the fin-shaped structures 211 underlying the dummy gate stack 250 may be referred to as channel regions. Each of the channel regions in a fin-shaped structure 211 is sandwiched between two source/drain regions for source/drain formation. In an example process, the dummy dielectric layer 242 is blanketly deposited over the workpiece 200 by CVD. A material layer for the dummy electrode 244 is then blanketly deposited over the dummy dielectric layer 242. The dummy dielectric layer 242 and the material layer for the dummy electrode 244 are then patterned using photolithography processes to form the dummy gate stack 250. In some embodiments, the dummy dielectric layer 242 may include silicon oxide and the dummy electrode 244 may include polycrystalline silicon (polysilicon).

Reference is made to FIG. 14. At block 116, at least one gate spacer 252 is formed along sidewalls of the dummy gate stacks 250. The at least one gate spacer 252 may include two or more gate spacer layers. Dielectric materials for the at least one gate spacer 252 may be selected to allow selective removal of the dummy gate stack 250. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the at least one gate spacer 252 may be conformally deposited over the workpiece 200 using CVD, subatmospheric CVD (SACVD), or ALD.

Referring to FIGS. 1 and 14, method 100 includes a block 118 where the source/drain regions of the fin-shaped structures 211 are recessed to form source/drain recesses 254. With the dummy gate stack 250 and the at least one gate spacer 252 serving as an etch mask, the workpiece 200 is anisotropically etched to form the source/drain recesses 254 (or source/drain trenches 254) over the source/drain regions of the fin-shaped structures 211. In some embodiments as illustrated in FIG. 14, operations at block 118 may substantially remove the top portions 212T of fin-shaped structures 211 in the source/drain regions. In some other alternative embodiments, the source/drain trenches 254 may extend into the base portions 211B. The anisotropic etch at block 118 may include a dry etch process. For example, the dry etch process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 15:
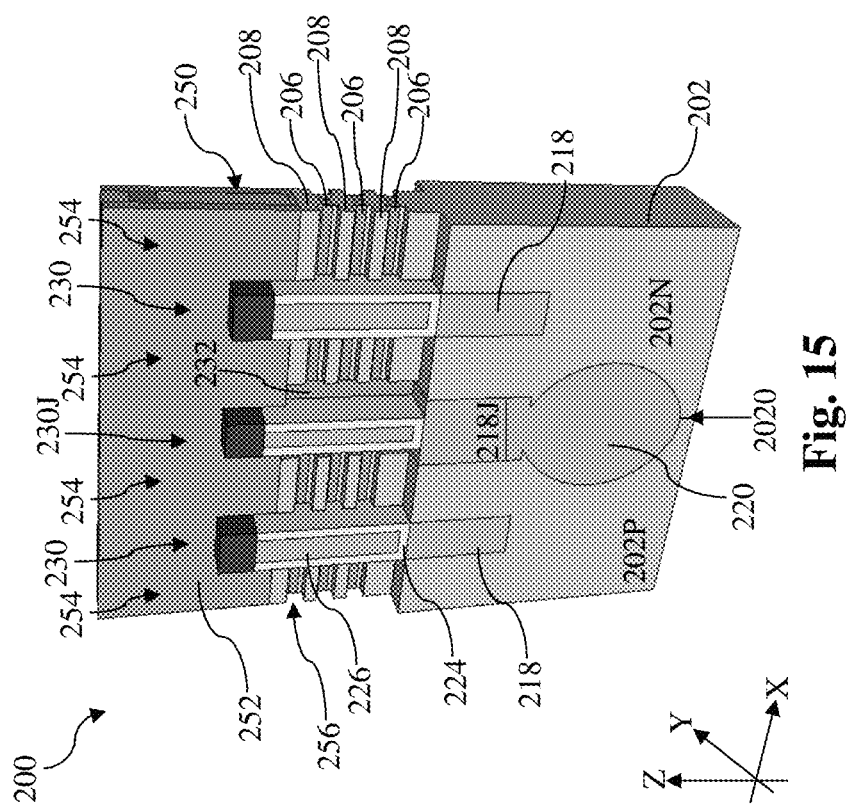
Figure 16:
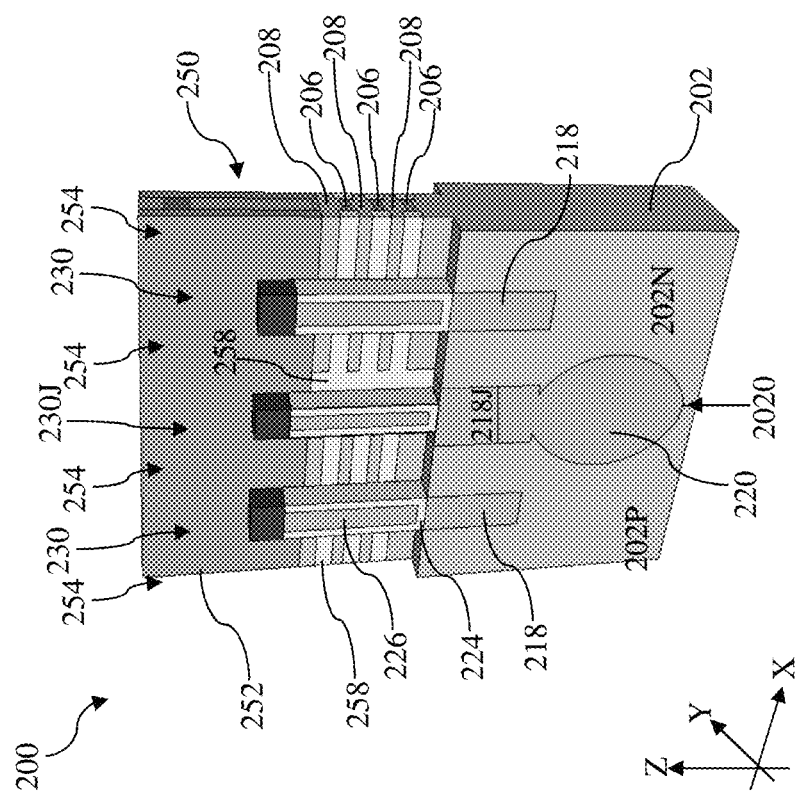

Referring to FIGS. 1, 15 and 16, method 100 includes a block 120 where inner spacer features 258 are formed. Referring to FIG. 15, at block 120, the sacrificial layers 206 exposed in the source/drain trenches 254 are first selectively and partially recessed to form inner spacer recesses, while the exposed channel layers 208 are substantially unetched. Because the cladding layer 232 and the sacrificial layers 206 share a similar composition, the cladding layer 232 may also be etched at block 120. In an embodiment where the channel layers 208 consist essentially of silicon (Si), sacrificial layers 206 consist essentially of silicon germanium (SiGe), and the cladding layer 232 consists essentially of silicon germanium (SiGe), the selective and partial recess of the sacrificial layers 206 and the cladding layer 232 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 and the cladding layer 232 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 232. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 258, as illustrated in FIG. 16.

Figure 17:
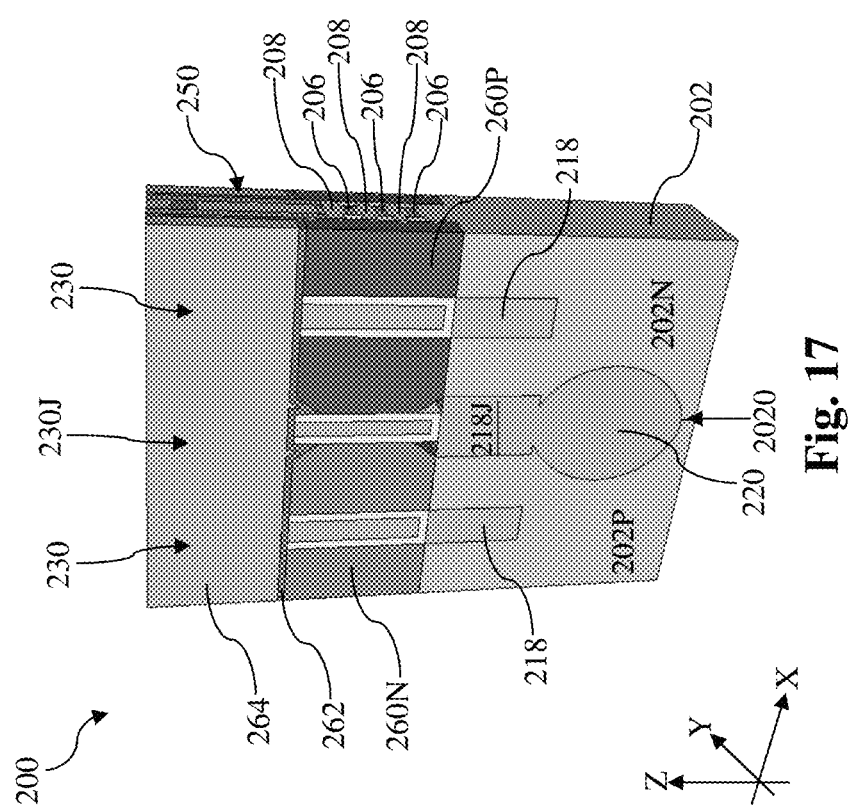

Referring to FIGS. 1 and 17, method 100 includes a block 122 where n-type source/drain features 260N and p-type source/drain features 260P are formed. The n-type source/drain features 260N and p-type source/drain features 260P are selectively and epitaxially deposited on the exposed semiconductor surfaces of the channel layers 208 and the substrate 202 in the source/drain trenches 254. The n-type source/drain features 260N and p-type source/drain features 260P may be sequentially deposited using an epitaxial process, such as vapor-phase epitaxy (VPE), ultra-high vacuum CVD (UHV-CVD), molecular beam epitaxy (MBE), and/or other suitable processes. In some embodiments, a first masking layer, such as a BARC layer, is deposited to selectively expose the source/drain trenches 254 over the p-well 202P and then the p-type source/drain features 260P are deposited over the exposed channel layers 208 and the substrate 202 over the n-well 202N. After the first masking layer is removed by ashing or stripping, a second masking layer, such as a BARC layer, is deposited to selectively expose the source/drain trenches over the n-well and then the n-type source/drain features 260N are deposited over the exposed channel layers and the substrate 202 over the p-well 202P. The second masking layer is then removed. The order of formation of the p-type source/drain features 260P and the n-type source/drain features may be switched. The n-type source/drain features 260N may include silicon (Si) doped with an n-type dopant, such as phosphorus (P) or arsenic (As). The p-type source/drain features 260P may include silicon germanium (SiGe) doped with a p-type dopant, such as boron (B) or gallium (Ga). Doping of the source/drain features may be performed either in situ with their deposition or ex situ using an implantation process, such as a junction implant process.

Referring still to FIGS. 1 and 17, method 100 includes a block 124 where a contact etch stop layer (CESL) 262 and an interlayer dielectric (ILD) 264 layer are deposited. In some embodiments, the helmet layer 240 of the dielectric fins 230 and the junction dielectric fin 230J are selectively etched back before the deposition of the CESL 262. In some instances, the helmet layer 240 may be selectively etched away using buffered hydrofluoric acid (BHF) or diluted hydrofluoric acid (DHF). After the removal of the helmet 240, the CESL 262 is first conformally deposited over the workpiece 200 and then the ILD layer 264 is blanketly deposited over the CESL 262. The CESL 262 may include silicon nitride, silicon oxide, silicon oxynitride, and/or other materials known in the art. The CESL 262 may be deposited using ALD, plasma-enhanced chemical vapor deposition (PECVD) process and/or other suitable deposition or oxidation processes. In some embodiments, the ILD layer 264 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 264 may be deposited by spin-on coating, an FCVD process, or other suitable deposition technique. In some embodiments, after formation of the ILD layer 264, the workpiece 200 may be annealed to improve integrity of the ILD layer 264. To remove excess materials and to expose top surfaces of the dummy electrode 244 of the dummy gate stacks 250, a planarization process (such as chemical mechanical polishing (CMP) process) may be performed to the workpiece 200 to provide a planar top surface. Top surfaces of the dummy electrodes 244 are exposed on the planar top surface.

Figure 18:
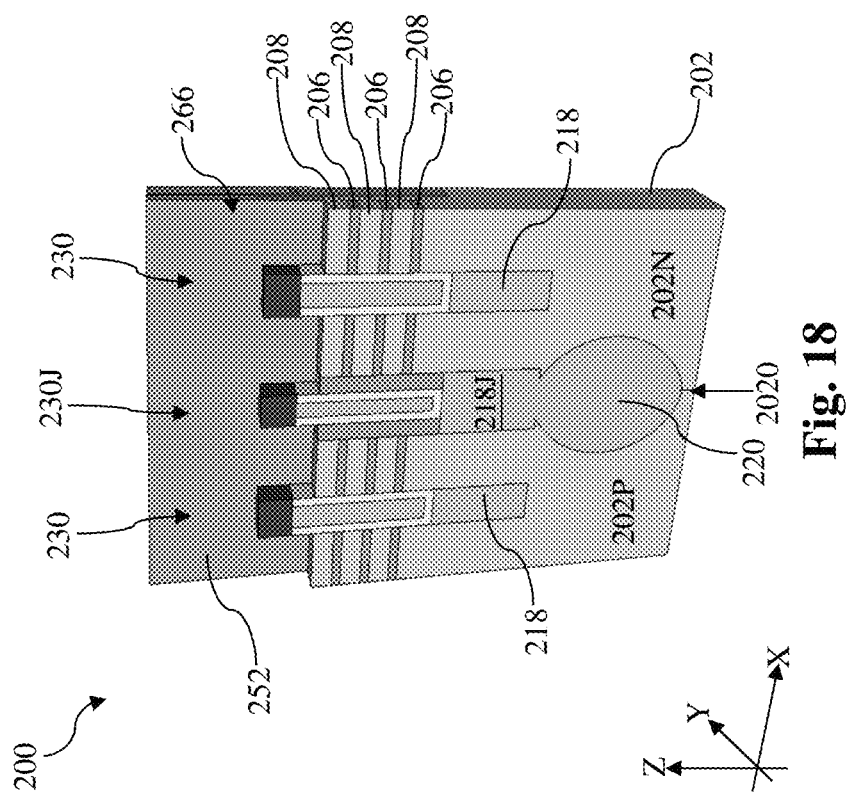

Referring to FIGS. 1, 18, 19, and 20, method 100 includes a block 126 where the dummy gate stacks 250 are replaced with a joint gate structure 270. Operations at block 126 include removal of the dummy gate stacks 250 (shown in FIG. 18), selective removal of the sacrificial layers 206 in the channel regions to release the channel members 2080 (shown in FIG. 19), and formation of a joint gate structure 270 to wrap around each of the channel members 2080 (shown in FIG. 20. Referring to FIG. 18, the dummy gate stack 250 exposed at the conclusion of block 124 is removed from the workpiece 200 by a selective etch process. The selective etch process may be a selective wet etch process, a selective dry etch process, or a combination thereof. In the depicted embodiments, the selective etch process selectively removes the dummy dielectric layer 242 and the dummy electrode 244 without substantially damaging the helmet layer 240 and the at least one gate spacer 252. The removal of the dummy gate stack 250 results in a gate trench 266 over the channel regions.

Figure 19:
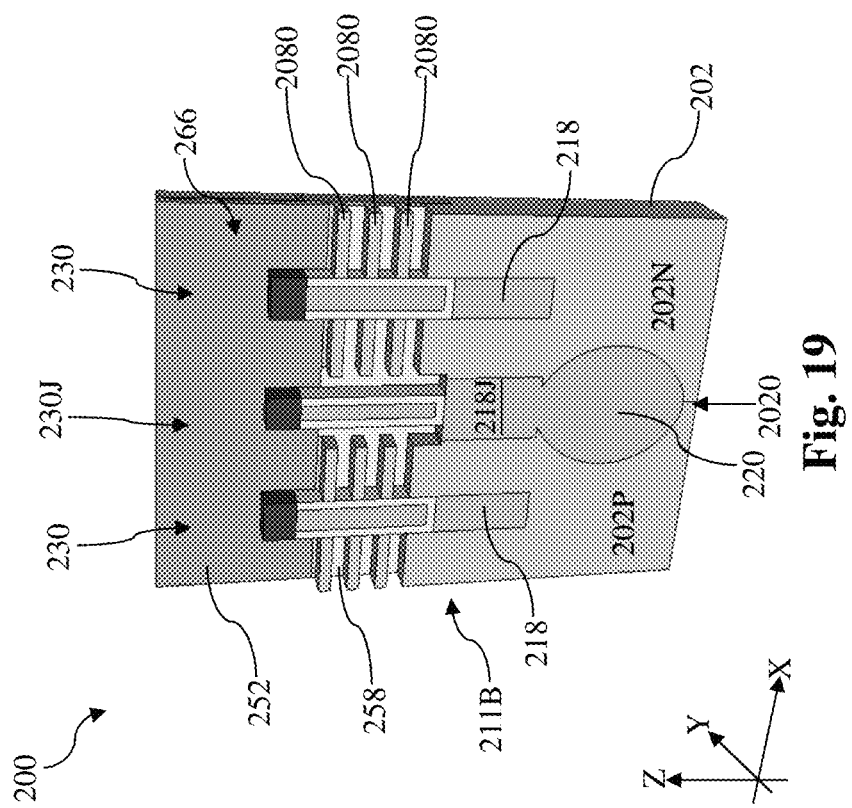

After the removal of the dummy gate stack 250, channel layers 208, sacrificial layers 206, and the cladding layer 232 in the channel region are exposed in the gate trenches 266. Referring to FIG. 19, the exposed sacrificial layers 206 between the channel layers 208 and the cladding layer 232 may be selectively removed to release the channel layers 208 as channel members 2080. In the depicted embodiments where the channel members 2080 resemble a sheet or a nanosheet, the channel member release process may also be referred to as a sheet formation process. Different from channel members of some MBC transistors, the channel members 2080 extend laterally from sidewalls of the dielectric fins 230. As shown in FIG. 19, after their release, the channel members 2080 are spaced apart from the junction dielectric fin 230J. The channel members 2080 are vertically stacked along the Z direction. The selective removal of the sacrificial layers 206 and the cladding layer 232 may be implemented by selective dry etch, selective wet etch, or other selective etch processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 232 in the channel region, the dielectric fins 230, the junction dielectric fin 230J, the channel members 2080, the top surface of the base portions 211B, the inner spacer features 258, and the junction isolation feature 218J are exposed in the gate trench 266.

Figure 20:
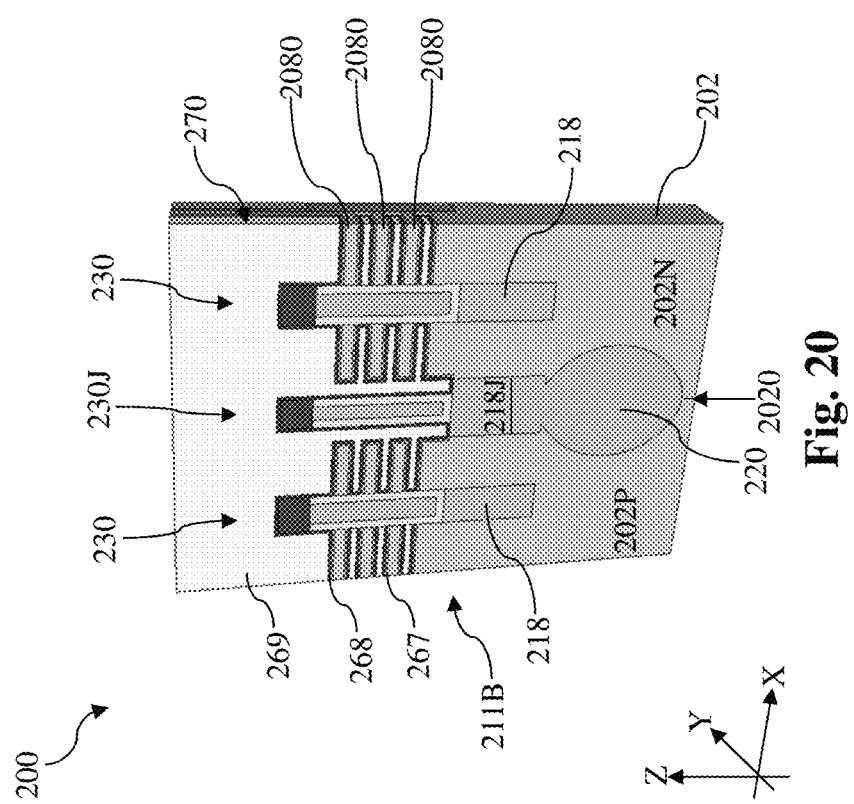

Referring to FIG. 20, the joint gate structure 270 is then deposited over the workpiece to wrap around each of the channel members 2080. The joint gate structure 270 may include an interfacial layer 267 on the channel members 2080 and the substrate 202, a gate dielectric layer 268 over the interfacial layer 267, and a gate electrode layer 269 over the gate dielectric layer 268. In some embodiments, the interfacial layer 267 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer 267. The gate dielectric layer 268 is then deposited over the interfacial layer 267 using ALD, CVD, and/or other suitable methods. The gate dielectric layer 268 may include high-k dielectric materials. As used herein, high-k dielectric materials include dielectric materials having a high dielectric constant, for example, greater than that of thermal silicon oxide (~3.9). In one embodiment, the gate dielectric layer 268 may include hafnium oxide. Alternatively, the gate dielectric layer 268 may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. After the formation or deposition of the interfacial layer 267 and the gate dielectric layer 268, the gate electrode layer 269 is deposited over the gate dielectric layer 268. The gate electrode layer 269 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 269 may be formed by ALD, PVD, CVD, e-beam evaporation, or other suitable process. As shown in FIG. 20, the joint gate structure 270 wraps around each of the channel members 2080. It is noted that the joint gate structure 270 does not extend between the dielectric fins 230 and the channel members 2080 as the channel members 2080 are in contact with the dielectric fins 230.

Figure 21:
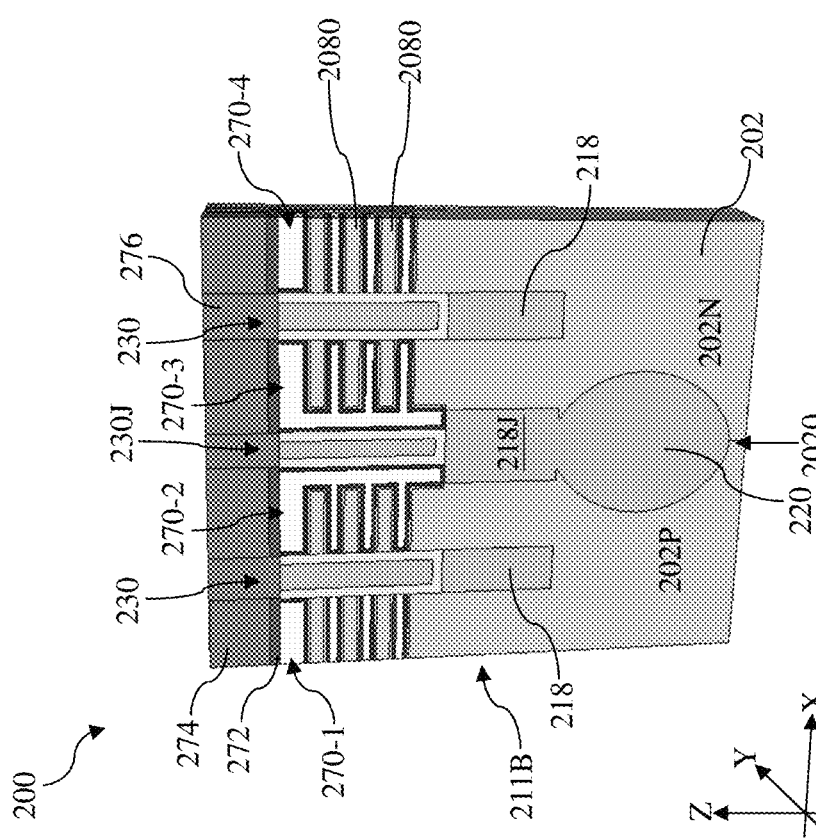
Figure 22:
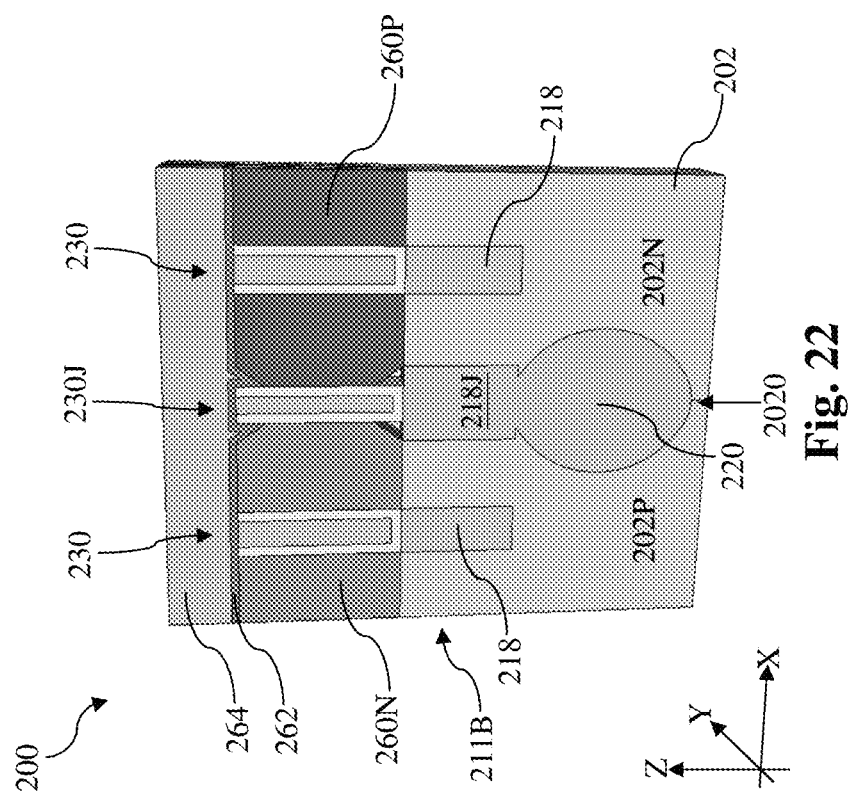

Referring to FIGS. 1, 21 and 22, method 100 includes a block 128 where further processes are performed. Such further processes may include, for example, planarization of the joint gate structure 270, etching back of the joint gate structure 270, deposition of a metal cap layer 272, deposition of a self-aligned cap (SAC) layer 274, and formation of gate cut features 276. Referring to FIG. 21, a planarization process, such as a CMP process, may be performed to the workpiece 200 until the helmet layer 240 is removed and the joint gate structure 270 is divided by the dielectric fins 230 and the junction dielectric fins 230J. In FIG. 21, the planarization divides the joint gate structure 270 into a first gate structure 270-1, a second gate structure 270-2, a third gate structure 270-3, and a fourth gate structure 270-4. The first gate structure 270-1 and the second gate structure 270-2 are separated by a dielectric fin 230. The second gate structure 270-2 and the third gate structure 270-3 are separated by the junction dielectric fin 230J. The third gate structure 270-3 and the fourth gate structure 270-4 are separated by a dielectric fin 230.

To make room for the metal cap layer 272, the first gate structure 270-1, the second gate structure 270-2, the third gate structure 270-3, and the fourth gate structures 270-4 may be selectively etched back. For example, the selective etch of the gate structures may include a selective wet etch process that uses nitric acid, hydrochloric acid, sulfuric acid, ammonium hydroxide, hydrogen peroxide, or a combination thereof. The metal cap layer 272 is then deposited over the first gate structure 270-1, the second gate structure 270-2, the third gate structure 270-3, and the fourth gate structure 270-4. In some embodiments, the metal cap layer 272 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 272 includes tungsten (W) and is deposited by PVD. In some alternative embodiments where the metal cap layer 272 is deposited by MOCVD, the deposition of the metal cap layer 272 may be selectively deposited on the first gate structure 270-1, the second gate structure 270-2, the third gate structure 270-3, and the fourth gate structure 270-4. After the deposition of the metal cap layer 272, the SAC layer 274 is deposited over the workpiece 200 by CVD, PECVD, or a suitable deposition process. The SAC layer 274 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etch processes are then performed to etch the deposited SAC layer 274 to form gate cut openings to expose the top surfaces of the dielectric fins 230 and the junction dielectric fin 230J. Thereafter, a dielectric material is deposited and planarized by a CMP process to form the gate cut features 276 in the gate cut openings. The dielectric material for the gate cut features 276 may be deposited using HDPCVD, CVD, ALD, or a suitable deposition technique. In some instances, the gate cut feature 276 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut feature 276 and the SAC layer 274 may have different compositions to introduce etch selectivity.

Figure 23:
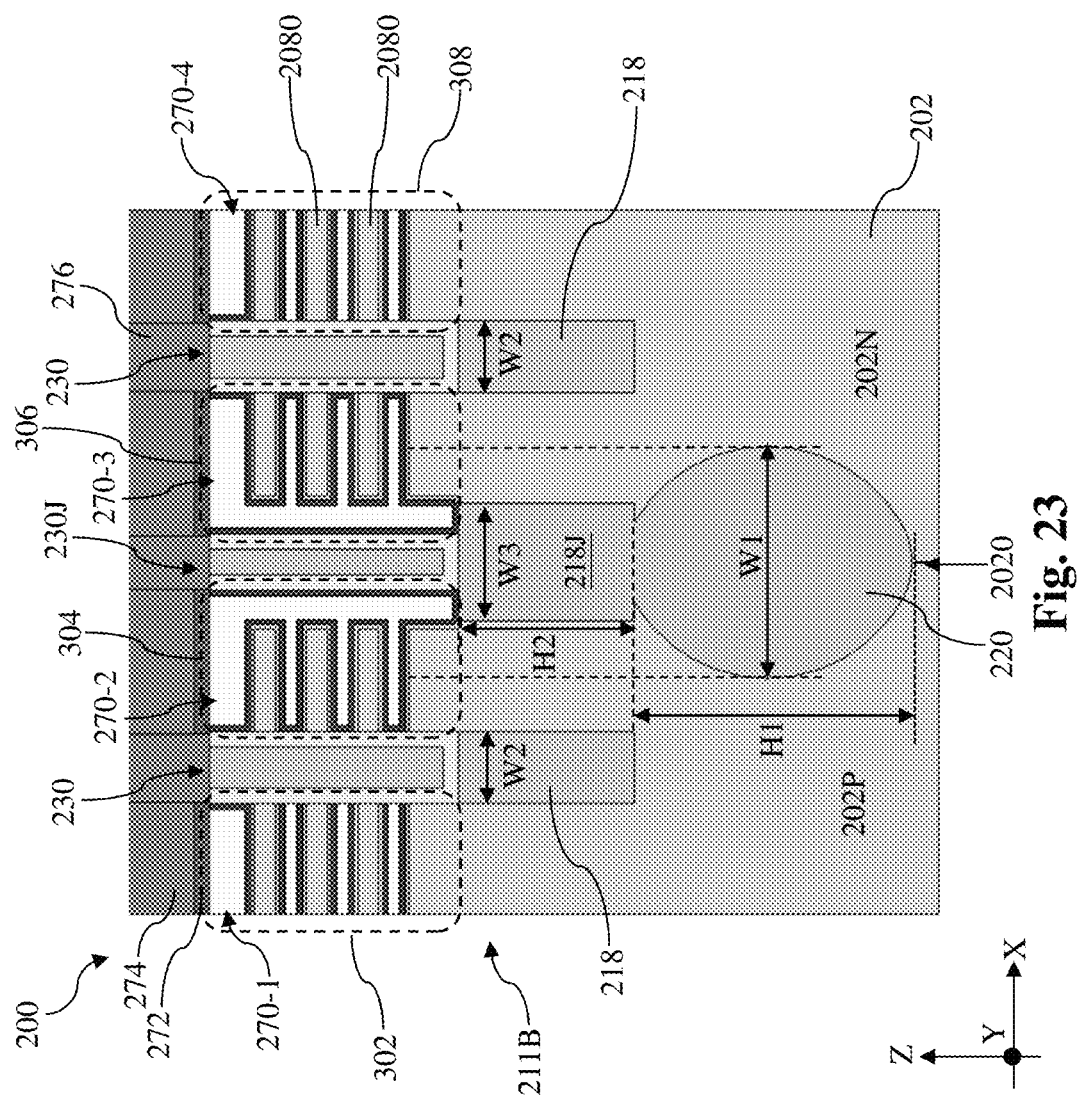

An enlarged fragmentary cross-sectional view of the channel region of the semiconductor device 200 in FIG. 21 is shown in FIG. 23. Each of the first gate structure 270-1, the second gate structure 270-2, the third gate structure 270-3, and the fourth gate structure 270-4 wraps around each of the vertical stacks of channel members 2080. The first gate structure 270-1 and the second gate structure 270-2 are separated by a dielectric fin 230. The second gate structure 270-2 and the third gate structure 270-3 are separated by the junction dielectric fin 230J. The third gate structure 270-3 and the fourth gate structure 270-4 are separated by a dielectric fin 230. The base portions 211B under the channel members 2080 are separated by isolation features 218 and the junction isolation feature 218J as well as lower portions of the dielectric fins 230 and the junction dielectric fins 230J. The deep isolation feature 220 may have a bulge shape when view along the Y direction. In some embodiments, the deep isolation feature 220 undercuts channel members 2080 wrapped around by the second gate structure 270-2 and the third gate structure 270-3, as shown by the dotted lines. The deep isolation feature 220 also undercuts the base portions 211B on both sides of the well junction 2020. In some instances, the deep isolation feature 220 may have a first height H1 between about 10 nm and about 100 nm along the Z direction and a first width W1 between about 5 nm and about 50 nm along the X direction. The junction isolation feature 218J may be wider than the isolation features 218. In some instances, the isolation features 218 may have a second width W2 between about 10 nm and about 20 nm and the junction isolation feature 218J may have a third width W3 between about 20 nm and about 30 nm. In one embodiment, the first width W1 is greater than the third width W3. In that embodiment, the first width W1 is between about 25 nm and about 50 nm. The isolation features 218 and the junction isolation feature 218J may have a second height H2 between about 1 nm and about 20 nm. The deep isolation feature 220 and the junction isolation feature 218J work in synergy to reduce bulk leakage across the well junction 2020, which is a boundary between the p-well 202P and the n-well 202N.

Referring still to FIG. 23, the first gate structure 270-1 controls a first n-type MBC transistor 302 disposed over the p-well 202P. The channel members 2080 of the first n-type MBC transistor 302 extend between two n-type source/drain features 260N. The second gate structure 270-2 controls a second n-type MBC transistor 304 disposed over the p-well 202P. The channel members 2080 of the second n-type MBC transistor 304 extend between two n-type source/drain features 260N. The third gate structure 270-3 controls a first p-type MBC transistor 306 disposed over the n-well 202N. The channel members 2080 of the first p-type MBC transistor 306 extend between two p-type source/drain features 260P. The fourth gate structure 270-4 controls a second p-type MBC transistor 308 disposed over the n-well 202N. The channel members 2080 of the second p-type MBC transistor 308 extend between two p-type source/drain features 260P. When viewed along the Y direction, each of the first gate structure 270-1, the second gate structure 270-2, the third gate structure 270-3, and the fourth gate structure 270-4 includes a fork-like or a fishbone-like structure. For that reason, the first n-type MBC transistor 302, the second n-type MBC transistor 304, the first p-type MBC transistor 306, and the second p-type MBC transistor 308 may be referred to as fork-sheet transistors or fishbone transistors.

Based on the above discussions, it can be seen that the present disclosure offers advantages. It is understood, however, that other embodiments may offer additional advantages, and not all advantages are necessarily disclosed herein, and that no particular advantage is required for all embodiments. For example, abutting n-well and p-well under fishbone or fork-sheet transistors are separated by a junction isolation feature and a deep isolation feature disposed below the junction isolation feature. The deep isolation feature may have a shape different from that of the junction isolation feature. The deep isolation feature works in synergy with the junction isolation feature to prevent bulk leakage across the well junction.

In one aspect, the present disclosure provides embodiments of a semiconductor structure that includes a substrate having a p-type well or an n-type well, a first base portion over the p-type well, a second base portion over the n-type well, a first plurality of channel members over the first base portion, a second plurality of channel members over the second base portion, an isolation feature disposed between the first base portion and the second base portion, and a deep isolation structure in the substrate disposed below the isolation feature.

In some embodiments, the isolation feature and the deep isolation structure extend through a junction between the p-type well and the n-type well. In some implementations, the deep isolation structure includes silicon oxide, silicon nitride, silicon oxynitride, silicon oxycarbide, silicon carbonitride, or silicon oxycarbonitride. In some instances, a shape of the isolation feature is different from a shape of the deep isolation structure. In some embodiments, the semiconductor structure may further include a first gate structure wrapping around each of the first plurality of channel members, a second gate structure wrapping around each of the second plurality of channel members, and a first dielectric fin disposed between the first gate structure and the second gate structure. In some instances, the first dielectric fin is disposed on the isolation feature. In some embodiments, a first portion of the first gate structure extends between the first dielectric fin and the first gate structure. In some implementations, the semiconductor structure may further include a second dielectric fin in contact with sidewalls of the first plurality of channel members. In some implementations, a second portion of the first gate structure extends between the first dielectric fin and the first base portion. In some instances, the semiconductor structure may further include a second dielectric fin in contact with the first base portion.

In another aspect, the present disclosure provides embodiments of a semiconductor structure that includes a substrate having a p-type well or an n-type well, a first base portion over the p-type well, a second base portion over the n-type well, a first n-type epitaxial feature over the first base portion, a first p-type epitaxial feature over the second base portion, a first isolation feature disposed between the first base portion and the second base portion, and a deep isolation structure in the substrate disposed directly below the first isolation feature.

In some embodiments, the semiconductor structure may further include a first dielectric fin disposed on the first isolation feature. The first dielectric fin is sandwiched between the first n-type epitaxial feature and the first p-type epitaxial feature and a width of the first dielectric fin is smaller than a width of the first isolation feature. In some embodiments, a shape of the first isolation feature is different from a shape of the deep isolation structure. In some instances, the semiconductor structure may further include a third base portion over the p-type well, a second n-type epitaxial feature over the third base portion, and a second isolation feature disposed between the first base portion and the third base portion. A width of the first isolation feature is greater than a width of the second isolation feature. In some instances, the semiconductor structure may further include a second dielectric fin disposed over the second isolation feature. The second dielectric fin is sandwiched between the first n-type epitaxial feature and the second n-type epitaxial feature and a width of the second dielectric fin is substantially identical to a width of the second isolation feature.

In yet another aspect, the present disclosure provides embodiments of a method that includes receiving a workpiece including a first fin-shaped structure over a p-type well region of a substrate and a second fin-shaped structure over an n-type well region of the substrate, the first fin-shaped structure and the second fin-shaped structure being spaced apart by a junction trench, extending the junction trench further into the substrate to form a deep pocket, forming a deep isolation feature in the deep pocket and an isolation feature in the junction trench, and forming a dielectric fin on the isolation feature such that the dielectric fin is disposed between the first fin-shaped structure and the second fin-shaped structure.

In some embodiments, the method may further include before the extending of the junction trench, forming a liner along sidewalls of the junction trench. In some implementations, the forming of the deep isolation feature and the isolation feature includes depositing a dielectric material into the deep pocket and the junction trench and etching back the liner and the dielectric material to expose sidewalls of the first fin-shaped structure and the second fin-shaped structure. In some instances, the method may further include before the forming of the dielectric fin, depositing a semiconductor cladding layer over the sidewalls of the first fin-shaped structure and the second fin-shaped structure. In some instances, after the forming of the dielectric fin, the dielectric fin is spaced apart from the first fin-shaped structure and the second fin-shaped structure by the semiconductor cladding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first base fin, a second base fin, and a third base fin arising from a substrate;
a first plurality of channel members over the first base fin;
a second plurality of channel members over the second base fin;
a first isolation feature disposed between the first base fin and the second base fin;

a second isolation feature disposed between the second base fin and the third base fin; and
a first dielectric fin disposed over the first isolation feature,
wherein the first dielectric fin is sandwiched between the first plurality of channel members and the second plurality of channel members along a direction.

2. The semiconductor structure of claim 1,
wherein first isolation feature comprises a first width along the direction,
wherein the second isolation feature comprises a second width along the direction,
wherein the second width is greater than the first width.

3. The semiconductor structure of claim 2, further comprising:
a deep isolation structure disposed below the second isolation feature,
wherein the deep isolation structure comprises a third width along the direction,
wherein the third width is greater than the second width.

4. The semiconductor structure of claim 1,
wherein the substrate comprises a p-type well region and an n-type well region,
wherein the first base fin and second base fin are disposed over the p-type well region,
wherein the third base fin is disposed over the n-type well region.

5. The semiconductor structure of claim 4, wherein the second isolation feature is disposed between the p-type well region and the n-type well region along the direction.

6. The semiconductor structure of claim 1, further comprises:
a first gate structure wrapping around each of the first plurality of channel members; and
a second gate structure wrapping around each of the second plurality of channel members.

7. The semiconductor structure of claim 6, wherein the first gate structure is insulated from the second gate structure by the first dielectric fin.

8. The semiconductor structure of claim 6, further comprising:
a second dielectric fin disposed over the second isolation feature,
wherein a portion of the second gate structure extends between the second plurality of channel members and the second dielectric fin.

9. The semiconductor structure of claim 8, wherein a portion of the second gate structure extends between the second base fin and the second dielectric fin.

10. The semiconductor structure of claim 8, wherein the portion of the second gate structure lands on a top surface of the second isolation feature.

11. A structure, comprising:
a first base fin, a second base fin, and a third base fin arising from a substrate;
a first plurality of channel members over the first base fin;
a second plurality of channel members over the second base fin;
a first isolation feature disposed between the first base fin and the second base fin;
a second isolation feature disposed between the second base fin and the third base fin;
a first dielectric fin disposed over the first isolation feature;
a second dielectric fin disposed over the second isolation feature;
a first gate structure wrapping around each of the first plurality of channel members; and
a second gate structure wrapping around each of the second plurality of channel members,
wherein a portion of the second gate structure extends between the second base fin and the second dielectric fin.

12. The structure of claim 11, wherein the first dielectric fin is sandwiched between the first plurality of channel members and the second plurality of channel members along a direction.

13. The structure of claim 11,
wherein the first dielectric fin comprises a first layer and second layer disposed over the first layer,
wherein the first layer is in direct contact with the first isolation feature, sidewalls of the first plurality of channel members, sidewalls of the second plurality of channel members, the first gate structure, and the second gate structure,
wherein the second layer is spaced apart from the first isolation feature, the sidewalls of the first plurality of channel members, the sidewalls of the second plurality of channel members, the first gate structure, and the second gate structure by the first layer.

14. The structure of claim 13, wherein a dielectric constant of the first layer is greater than a dielectric constant of the second layer.

15. The structure of claim 14,
wherein the first layer comprises silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide,
wherein the second layer comprises silicon oxide, silicon carbide, silicon oxynitride, or silicon oxycarbonitride.

16. The structure of claim 11, wherein top surfaces of the first dielectric fin and the second dielectric fin are higher than topmost ones of the first plurality of channel members.

17. A semiconductor structure, comprising:
a substrate comprising a first well region and a second well region;
a first base fin over the first well region;
a second base fin over the second well region;
a first plurality of channel members over the first base fin;
a second plurality of channel members over the second base fin;
a junction isolation feature disposed between the first base fin and the second base fin along a direction;
a dielectric fin disposed over the junction isolation feature;
a first gate structure wrapping around each of the first plurality of channel members; and
a second gate structure wrapping around each of the second plurality of channel members,
wherein the dielectric fin is sandwiched between the first gate structure and the second gate structure along the direction,
wherein a portion of the first gate structure and a portion of the second gate structure are in contact with a top surface of the junction isolation feature.

18. The semiconductor structure of claim 17, further comprising:
a deep isolation structure disposed below the junction isolation feature.

19. The semiconductor structure of claim 18,
wherein the dielectric fin comprises a first width along the direction, wherein the junction isolation feature comprises a second width along the direction,
wherein the deep isolation structure comprises a third width along the direction,
wherein the third width is greater than the second width,
wherein the second width is greater than the first width.

20. The semiconductor structure of claim 18, wherein the deep isolation structure undercut the first plurality of channel members and the second plurality of channel members.

* * * * *